US009272882B2

(12) United States Patent
Soldner et al.

(10) Patent No.: US 9,272,882 B2
(45) Date of Patent: Mar. 1, 2016

(54) DETECTION OF PEOPLE RELATIVE TO A PASSENGER CONVEYOR WITH A CAPACITIVE SENSOR

(75) Inventors: Nicholas C. Soldner, West Hartford, CT (US); Arthur C. Hsu, South Glastonbury, CT (US); William A. Veronesi, Hartford, CT (US); Bryan R. Siewert, Clinton, CT (US); Gero Gschwendtner, Vienna (AT); Abdullah Ercan, Vienna (AT); Alois Senger, Gresten (AT)

(73) Assignee: OTIS ELEVATOR COMPANY, Farmington, CT (US)

( * ) Notice: Subject to any disclaimer, the term of this patent is extended or adjusted under 35 U.S.C. 154(b) by 361 days.

(21) Appl. No.: 13/515,446

(22) PCT Filed: Dec. 18, 2009

(86) PCT No.: PCT/US2009/068805
§ 371 (c)(1),
(2), (4) Date: Jun. 12, 2012

(87) PCT Pub. No.: WO2011/075146
PCT Pub. Date: Jun. 23, 2011

(65) Prior Publication Data
US 2012/0247919 A1    Oct. 4, 2012

(51) Int. Cl.
*B66B 25/00* (2006.01)
*G06F 3/044* (2006.01)
*G01R 15/16* (2006.01)

(52) U.S. Cl.
CPC ............... *B66B 25/00* (2013.01); *B66B 25/006* (2013.01); *G01R 15/16* (2013.01); *G06F 3/044* (2013.01)

(58) Field of Classification Search
CPC .............................. B66B 25/00; B66B 29/005
USPC ................................................... 198/322, 323
See application file for complete search history.

(56) References Cited

U.S. PATENT DOCUMENTS 4,499,986 A * 2/1985 Tsuboi .................... H02P 25/18
                                                              198/322
4,796,013 A * 1/1989 Yasuda et al. ................. 340/562

(Continued)

FOREIGN PATENT DOCUMENTS

DE      2060357 A1    6/1972
DE     20122277 U1   11/2004

(Continued)

OTHER PUBLICATIONS

European Search report for application EP 09852403.6, Issued Sep. 15, 2015, 6 pages.

(Continued)

*Primary Examiner* — Gene Crawford
*Assistant Examiner* — Thomas Randazzo
(74) *Attorney, Agent, or Firm* — Cantor Colburn LLP

(57) ABSTRACT

A system for detecting a person relative to a passenger conveyor includes a driving circuit for supplying an oscillating drive signal to a first electrode of a capacitive sensor configured to produce an electric field toward a second electrode in response to the oscillating drive signal. A detection circuit is connected to the capacitive sensor, and produces an output as a function of the capacitance of the capacitive sensor, such that the detection circuit senses a change in capacitance of the capacitive sensor, such as when a person enters the electric field between the first and second electrodes. A controller is responsive to the change in capacitance sensed by the detection circuit to selectively adjust an operation mode of the passenger conveyor.

11 Claims, 5 Drawing Sheets

(56) References Cited

U.S. PATENT DOCUMENTS

| | | | | |
|---|---|---|---|---|
| 5,704,464 | A * | 1/1998 | Ahls | B66B 25/00 198/322 |
| 5,785,165 | A * | 7/1998 | Stahlhut et al. | 198/322 |
| 5,842,554 | A | 12/1998 | Stoxen et al. | |
| 5,914,701 | A | 6/1999 | Gersheneld et al. | |
| 5,923,005 | A | 7/1999 | Blondiau et al. | |
| 6,158,768 | A * | 12/2000 | Steffens et al. | 280/735 |
| 6,241,070 | B1 * | 6/2001 | Loder | B66B 29/06 198/323 |
| 6,249,130 | B1 * | 6/2001 | Greer | 324/687 |
| 6,334,522 | B2 | 1/2002 | Haruta et al. | |
| 6,368,469 | B1 | 4/2002 | Nulman et al. | |
| 6,373,235 | B1 * | 4/2002 | Barker | 324/76.53 |
| 6,700,393 | B2 * | 3/2004 | Haag | E05F 15/46 324/658 |
| 7,116,117 | B2 * | 10/2006 | Nakano | H03K 17/955 324/658 |
| 7,518,443 | B2 * | 4/2009 | Matthews | 330/10 |
| 7,568,570 | B2 * | 8/2009 | Stripling | B66B 29/005 198/322 |
| 7,775,339 | B2 * | 8/2010 | Ogimura | B66B 29/02 198/323 |
| 8,269,512 | B2 * | 9/2012 | Ootaka | B60R 21/01532 297/217.3 |
| 8,471,572 | B2 * | 6/2013 | Bauer | G01R 15/165 324/686 |
| 8,610,009 | B2 * | 12/2013 | Yilmaz et al. | 178/18.06 |
| 9,000,955 | B2 * | 4/2015 | Fasshauer | 341/20 |
| 2001/0002644 | A1 * | 6/2001 | Haruta | B66B 25/00 198/322 |
| 2006/0071774 | A1 * | 4/2006 | Brown et al. | 340/522 |
| 2006/0109135 | A1 | 5/2006 | Donat et al. | |
| 2008/0088413 | A1 | 4/2008 | Richter | |
| 2009/0223578 | A1 * | 9/2009 | Gulbranson | 137/559 |
| 2009/0243633 | A1 * | 10/2009 | Brasseur | G01D 5/2405 324/681 |
| 2010/0060489 | A1 | 3/2010 | Fasshauer et al. | |
| 2010/0292945 | A1 * | 11/2010 | Reynolds | G06F 3/044 702/65 |
| 2011/0133756 | A1 * | 6/2011 | Reime | 324/658 |

FOREIGN PATENT DOCUMENTS

| | | |
|---|---|---|
| EP | 0086942 A2 | 8/1983 |
| JP | 1317987 | 12/1989 |
| JP | 2000509497 A | 7/2000 |
| JP | 2003182962 A | 7/2003 |
| JP | 2006176327 A | 7/2006 |
| JP | 2006193258 A | 7/2006 |
| JP | 2007131411 A | 5/2007 |
| WO | 9817966 | 4/1998 |
| WO | 03011738 A1 | 2/2003 |
| WO | 2005089473 A2 | 9/2005 |
| WO | 2008064864 A2 | 6/2008 |

OTHER PUBLICATIONS

International Search Report and Written Opinion of the Patent Cooperation Treaty Office in Application No. PCT/US2009/068805, dated Aug. 18, 2010.

English translation of Office Action for Korean Patent Application No. 10-2012-7016610.

* cited by examiner

DETECTION OF PEOPLE RELATIVE TO A PASSENGER CONVEYOR WITH A CAPACITIVE SENSOR

BACKGROUND

The present invention relates generally to passenger conveyors and, more particularly, to systems for detecting a person's position relative to the passenger conveyor.

Passenger conveyors, such as escalators and moving walkways, are used to efficiently convey passengers from a first location to a second location. A typical escalator comprises a plurality of moving steps that are linked together and attached to chains that travel over a pair of sprockets at each end of the escalator, one of which is driven by a machine. A balustrade flanks each side of the moving steps, and each balustrade includes a moving handrail that moves simultaneously with the steps. A typical moving walkway contains many of the same components as the escalator, except that the walkway is substantially flat rather than inclined and uses pallets instead of steps.

Passenger sensing systems have been used to either cease or trigger operation of the passenger conveyor for safety reasons, maintenance reasons, or energy-cost savings. Typically these passenger sensing systems have used multiple sensors at the entrance and exit gates or along the length of the passenger conveyor in order to detect whether there is a person approaching the entrance and exit gates or riding on the passenger conveyor. These sensors have been optical sensors, infrared sensors, piezoelectric sensors, or RF transmitters. Because the number of sensors required increases as the length of the passenger conveyor increases, these systems can be prohibitively expensive to install and maintain.

SUMMARY

The present invention is a system for detecting a person relative to a passenger conveyer. The system includes a driving circuit for supplying an oscillating drive signal, a capacitive sensor having a first electrode configured to produce an electric field toward a second electrode in response to the oscillating drive signal, a detection circuit connected to the capacitive sensor to sense changes in capacitance of the capacitive sensor, and a controller. When a person disrupts the electric field between the first and second electrodes, the detection circuit senses a change in capacitance of the capacitive sensor and produces an output as a function of capacitance. Based on the change sensed by the detection circuit, the controller selectively adjusts an operation mode of the passenger conveyor, such as by controlling the passenger conveyor to start, slow down, speed up, stop, or prevent starting.

The present invention has at least two applications: detecting a person between the balustrades of the passenger conveyor and detecting a person within the machine room of the passenger conveyor. To detect a person between balustrades of the passenger conveyor, an electrical signal is supplied to a first electrode on a first balustrade to generate an electric field in the space between the first electrode and a second electrode on a second balustrade opposite the first balustrade. When a passenger is present on the passenger conveyor, a change in capacitance between the first and second electrodes is detected. The operation of the passenger conveyor is controlled as a function of the capacitance change detected. To detect a person in the machine room of the passenger conveyor, an electrical signal is transmitted to a sense wire located in the machine room to create an electric field between the wire and an electrically isolated component within the machine room. The presence of a person in the machine room will disrupt the electric field and change the capacitance between the sense wire and the component. This change in capacitance is detected using a detection circuit, and operation of the passenger conveyor is controlled as a function of the capacitance change detected.

DETAILED DESCRIPTION

Figure 1:
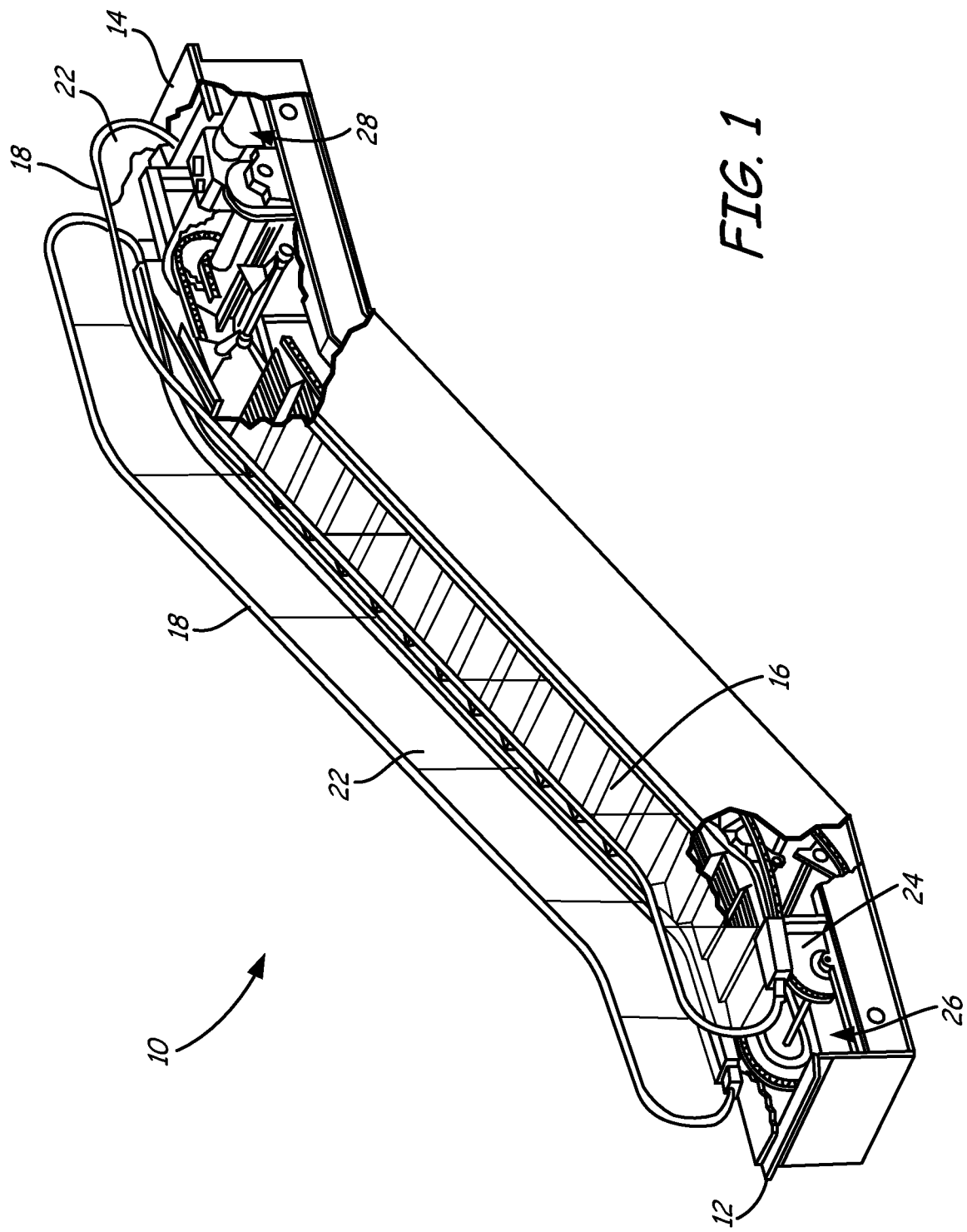
FIG. 1 is a perspective view of a passenger conveyor, including machine rooms housing portions of the drive system of the passenger conveyor.

The present invention concerns the detection of a person's location relative to a passenger conveyor, such as an escalator, moving walkway, or the like. FIG. 1 is a perspective view of escalator 10, which includes first landing 12, second landing 14, a continuous loop of steps 16, handrails 18, balustrades 22 defining a passenger riding area therebetween, drive system 24, and machine rooms 26, 28. Steps 16 extend from first landing 12 to second landing 14. Balustrades 22 extend along the side of steps 16 from first landing 12 to second landing 14, and handrails 18 are slidingly engaged with each balustrade 22. Drive system 24 is configured to drive steps 16 and handrails 18 at a constant speed and in synchrony with one another. A first portion of drive system 24 is located in machine room 26 and a second portion of drive system 24 is located in machine room 28.

The present invention concerns the detection of a person's location relative to escalator 10. At any given time, a person may be located in the passenger riding area between balustrades 22 while riding along escalator 10, or may be located in machine rooms 26, 28 or between balustrades 22 while providing maintenance assistance while the escalator is not moving. Based on the location of a person, it may be desirable to start or stop drive system 24, or to prevent drive system 24 from starting, for efficiency and safety reasons. The present invention detects a person's location relative to escalator 10 using electric fields and transmits that information to a detection circuit in order to determine whether it is necessary to start or stop drive system 24.

Figure 2:
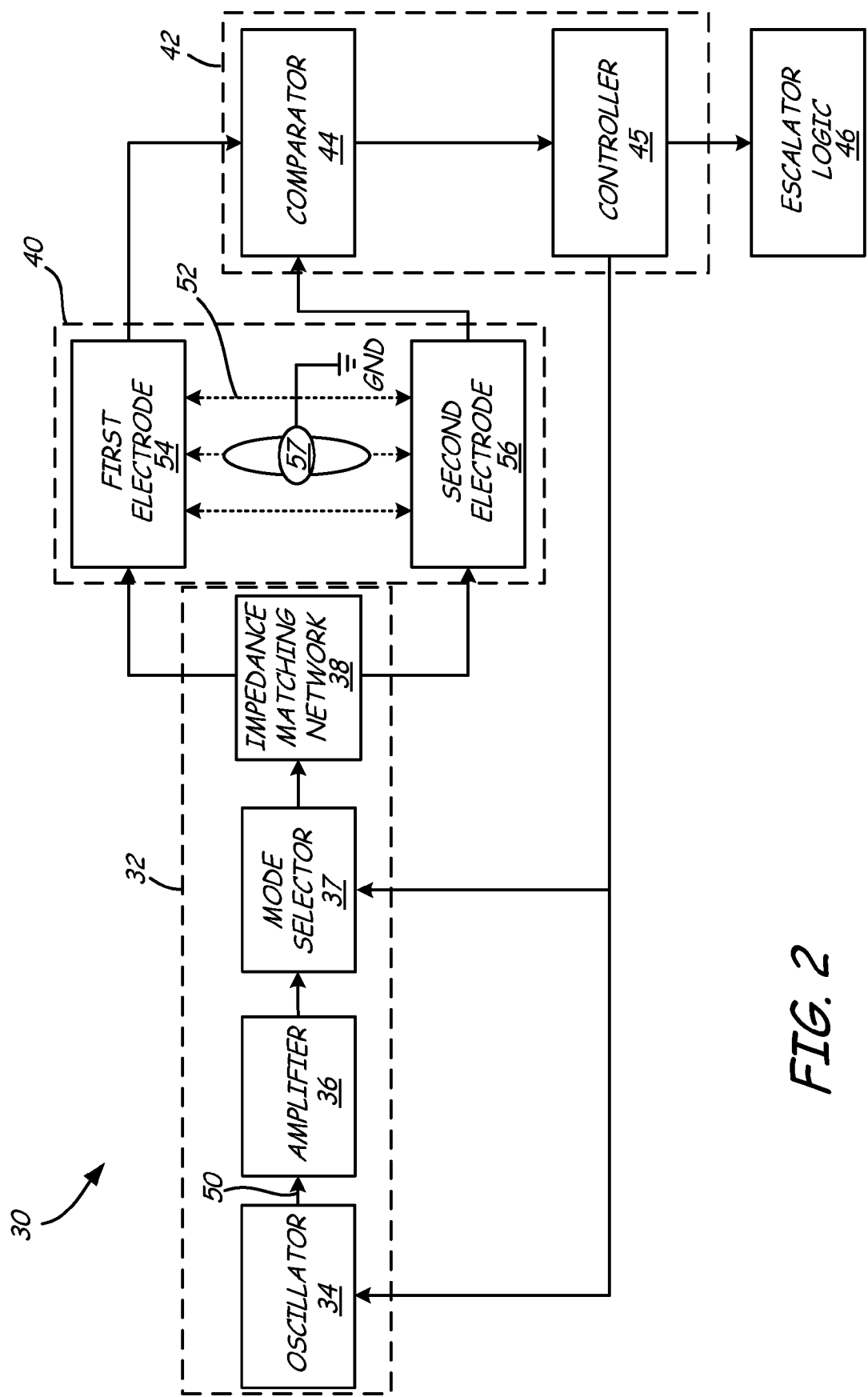
FIG. 2 is a block diagram of a detection system for use with a passenger conveyor according to an embodiment of the present invention.

FIG. 2 is a block diagram of detection system 30 according to an embodiment of the present invention. Detection system 30 includes drive circuit 32 (which includes oscillator 34, amplifier 36, mode selector 37 and impedance matching network 38), capacitive sensor 40 and detection circuit 42. Detection circuit 42 includes comparator 44 and controller 45 and is in communication with logic circuit 46 of escalator 10.

Controller 45 supplies current to oscillator 34, which generates electrical signal 50. Control signals from controller 45 are also routed to mode selector 37 to command mode selector 37 to drive capacitive sensor 40 in one of three modes: absorption mode, transmission mode, or loading mode.

Oscillator 34 is typically either a crystal-based (piezoelectric) oscillator or is driven directly by an output of controller 45. Oscillator 34 can operate in the range of 100 kHz to 1 MHz, but preferably operates between 100-150 kHz. Electrical signal 50 created by oscillator 34 is a low-power oscillating drive signal, which is limited to a power of less than 500 mW. Electrical signal 50 is amplified by amplifier 36 and transmitted to capacitive sensor 40 through mode selector 37 and impedance matching network 38, which may be implemented with one or more varactors in an exemplary embodiment Impedance matching network 38 is controlled by an output of controller 45 and ensures that electrical signal 50 is efficiently delivered to capacitive sensor 40, despite varying capacitance of sensor 40. Electrical signal 50 is applied to capacitive sensor 40 to create static electric field 52 between first electrode 54 and second electrode 56 of capacitive sensor 40.

When person 57 is located between first electrode 54 and second electrode 56, a perturbation occurs in the quasi-static electric field 52. This perturbation is detectable by detector circuit 42. Detection circuit 42 includes comparator 44 and controller 45, in communication with logic system 46. Based on an output received from capacitive sensor 40, comparator 44 outputs a difference in voltage between first electrode 54 and second electrode 56 to controller 45. Controller 45 is a microprocessor that executes algorithms that are used to process the output from comparator 44. These algorithms process the output from comparator 44, using several detection modes in some embodiments (discussed in detail below with respect to FIGS. 3A-3F), to search for patterns and differences in the capacitance over time to indicate the presence of a person, multiple people, or other conditions. Controller 45 communicates with logic system 46. Based on the detected changes in capacitance of capacitive sensor 40, controller 45 and logic system 46 determine whether a change in the operation mode of passenger conveyor is needed (i.e. to start, stop or slow the passenger conveyor, or even prevent the passenger conveyor from starting).

This system operates on the premise that a person's dielectric constant is significantly higher than the dielectric constant of air. The equation for capacitance is as follows:

$$C = \varepsilon_r \varepsilon_0 \frac{A}{d},$$

where C is capacitance in farads, $\varepsilon_r$ is the dielectric constant (or relative permittivity) of an object between first electrode 54 and second electrode 56, $\varepsilon_0$ is the permittivity in a vacuum ($8.854 \times 10^{-12}$ F/m), A is the area that first electrode 54 and second electrode 56 overlap in square meters, and d is the distance between first electrode 54 and second electrode 56 in meters. For air, the dielectric constant $\varepsilon_r$ is approximately 1.00. For humans, the dielectric constant $\varepsilon_r$ is roughly between 60 and 90 depending on various factors. Therefore, the capacitance of the capacitive sensor 40 will change significantly when a human is between first electrode 54 and second electrode 56. This change in capacitance will be detected by detection circuit 42. Materials that are closer to the dielectric constant of air, such as paper ($\varepsilon_r=3.5$) or rubber ($\varepsilon_r=7$), will not cause as great of a change of capacitance and thus may not be detectable (although some scientific texts indicate that experimentation has shown that capacitive changes as small as $0.05 \times 10^{-18}$ F can be detected).

As was mentioned above, capacitive sensor 40 and detection circuit 42 may operate in any of three detection modes. These modes are absorption (or shunt) mode, transmission mode, and loading mode. FIGS. 3A-3F are diagrams illustrating these three detection modes in detail.

Figure 3A:
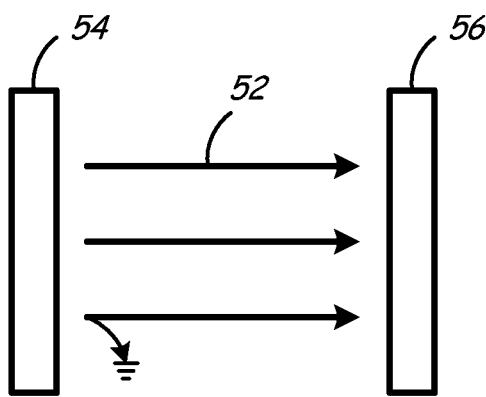
FIGS. 3A-3F are diagrams illustrating exemplary operating modes of the detection system of the present invention.
Figure 3B:
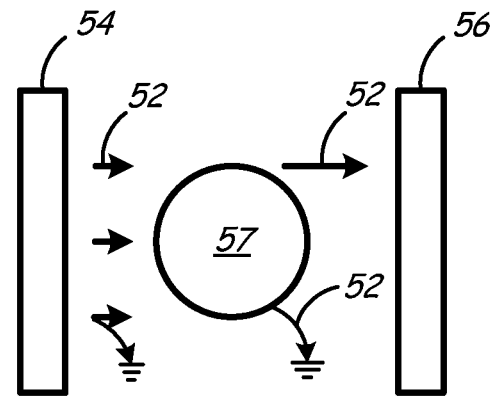

FIGS. 3A-3B show capacitive sensor 40 in absorption mode. First electrode 54 produces electric field 52 (e.g., a quasi-static electric field) toward second electrode 56. When no body is present between first electrode 54 and second electrode 56, second electrode 56 receives electric field 52 at a steady-state intensity (with a portion of electric field 52 being shunted to ground). When body 57 (such as a person or other object) is present between first electrode 54 and second electrode 56, as shown in FIG. 3B, electric field 52 is perturbed so that second electrode 56 receives a weaker electric field 52, as a portion of electric field 52 is shunted through body 57 to ground and does not reach second electrode 56.

Figure 3C:
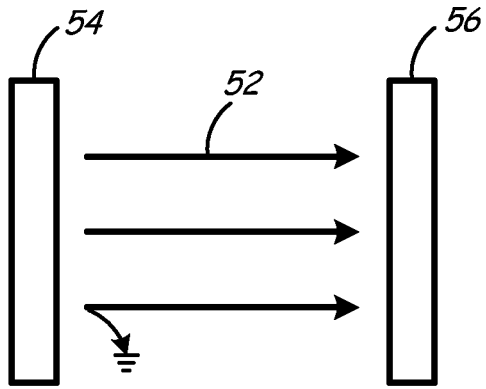
Figure 3D:
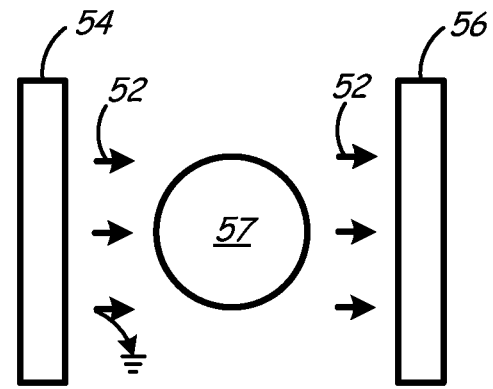

FIGS. 3C-3D show capacitive sensor 40 in transmission mode. First electrode 54 produces electric field 52 (e.g., a quasi-static electric field) towards second electrode 56 (with a portion of electric field 52 being shunted to ground). When no body is present between first electrode 54 and second electrode 56, the capacitance between first electrode 54 and second electrode 56 has a fixed value. When body 57 (such as a person or other object) is present between first electrode 54 and second electrode 56, as shown in FIG. 3D, the field producer becomes the combination of first electrode 54 and body 57 capacitively coupled to one another, and the capacitance between this field producer and second electrode 56 varies depending on the characteristics and location of body 57.

Figure 3E:
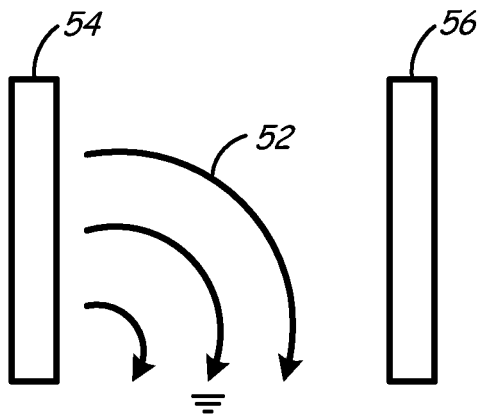
Figure 3F:
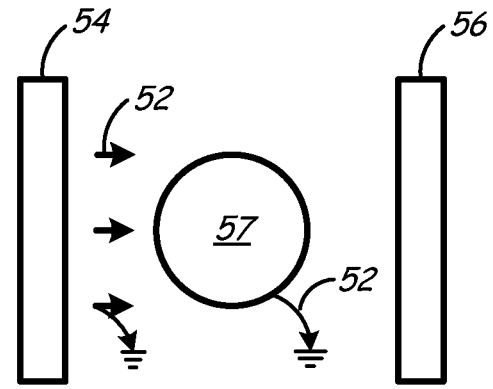

FIGS. 3E-3F show capacitive sensor 40 in loading mode. First electrode 54 produces electric field 52 (e.g., a quasi-static electric field), at least a portion of which is shunted to ground (second electrode 56 does not function as capacitive sensor in this mode). When body 57 (such as a person or other object) is present adjacent first electrode 54 (i.e., between first electrode 54 and second electrode 56), as shown in FIG. 3F, electrical field 52 is perturbed and shunted to ground through body 57, resulting in a detectable loading effect that varies with the capacitance between first electrode 54 and body 57, based on the characteristics and location of body 57. Second electrode 56 could also produce an electric field in this mode instead of or in addition to first electrode 54.

There are at least two applications for use of this technology in a passenger conveyor: detecting a person on escalator 10 (particularly between balustrades 22) and detecting a person in machine room 26, 28. The circuitry described above and shown in FIG. 2 is applicable to both of these applications, with slight variations in the realization of capacitive sensor 40. Where the person being detected is a passenger on escalator 10, balustrades 22 form or support first and second electrodes 54, 56 of capacitive sensor 40. Where the person being detected is a maintenance person in machine rooms 26, 28, a sense wire acts as first electrode 54 and the grounded machinery acts as second electrode 56 to form capacitive sensor 40. The specifics of each of these applications will be discussed in further detail below.

In order to detect a person between balustrades 22 of a passenger conveyor, with balustrades 22 forming capacitive sensor 40, a conductive material is applied to each balustrade 22 to create capacitive sensor 40. This is particularly applicable to balustrades 22 having non-conducting surfaces, such as glass surfaces. It is important that the conductive material be spaced sufficiently away from any metallic portions surrounding the non-conductive surfaces of balustrades 22, since these metallic portions act essentially as a ground. If the conductive material is too close to metallic portions, electrical signals could be shunted to these grounded metallic portions and thus the range and sensitivity of the detection system be decreased. It is allowable, however, that a limited number of small sections of the detections system come close to the conductive portions of the balustrade in order to make necessary circuitry connections.

Figure 4A:
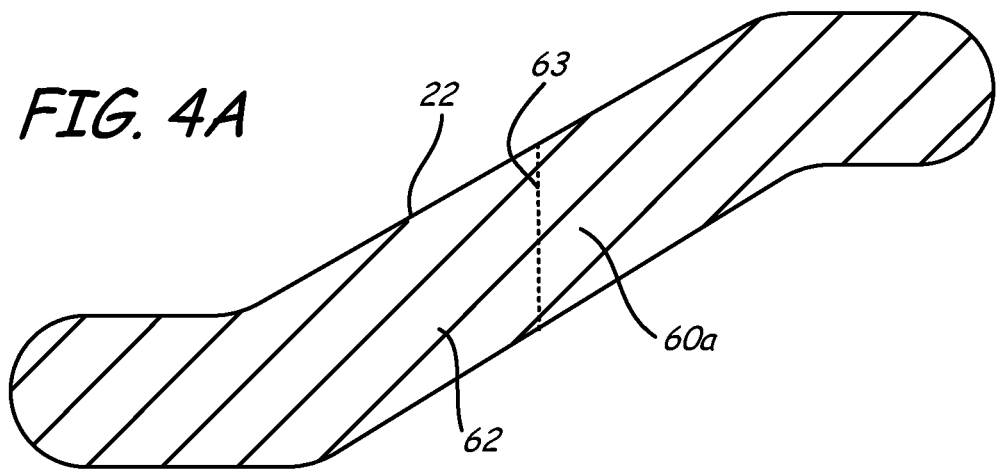
FIGS. 4A-4C are diagrams illustrating exemplary configurations of conductive material on the balustrade of the passenger conveyor.
Figure 4B:
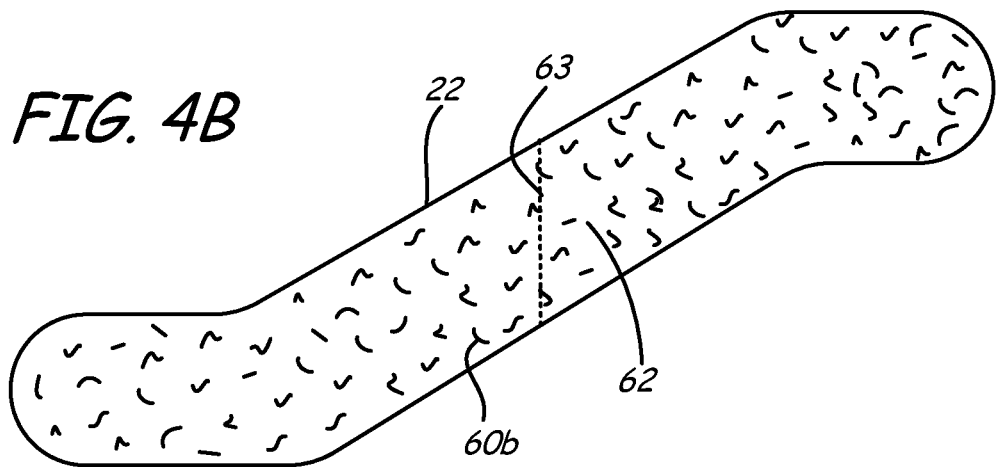
Figure 4C:
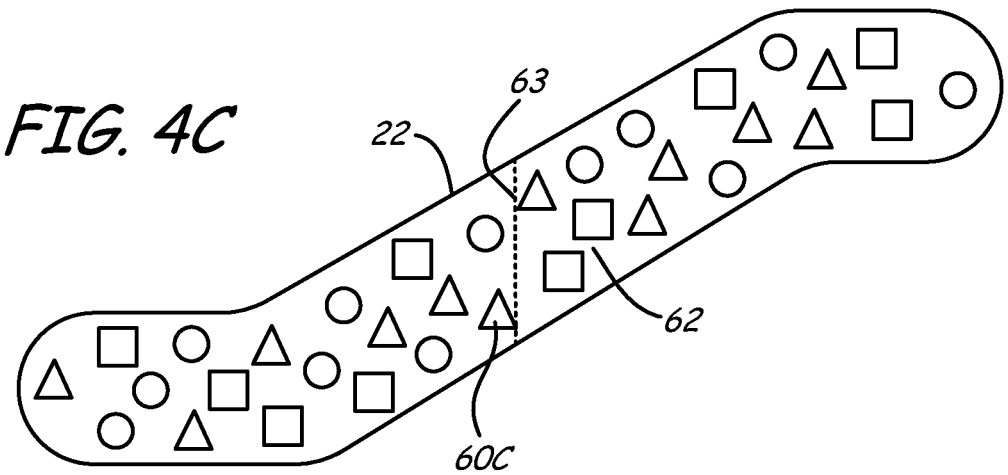

FIGS. 4A-4C are diagrams illustrating several exemplary ways that a conductive material 60 can be applied to non-conducting surface 62 of balustrade 22 in order to create capacitive sensor 40. FIG. 4A shows an embodiment in which a mesh or transparent conductive film 60a is laminated to non-conducting surface 62 of balustrade 22. This mesh or transparent conductive film 60a may be applied during manufacture of non-conducting surface 62 or could be later applied to non-conducting surface 62 in order to retro-fit existing passenger conveyors. FIG. 4B shows an embodiment in which the glass itself includes conductive elements 60b formed in the glass manufacturing process. FIG. 4C shows an embodiment in which conductive decals 60c are attached to the non-conducting surface 62. While other methods may be used to apply conductive material 60 to non-conducting surface 62 of each balustrade 22, it is important that conductive material 60 does not come too close to any of the metallic portions surrounding the non-conducting surface 62, since these metallic portions essentially act as a ground. If conductive material 60 comes too close to these grounded areas, the signal could be shunted to these grounded areas, which would result in decreased sensitivity and range. For applications where balustrade 22 is metallic, it would need to be electrically isolated from the opposite balustrade 22.

As discussed above, the area of balustrades 22 (more particularly, the surface area of conductive material 60 disposed on balustrades 22) directly affects the change in capacitance (and thus the detection sensitivity) when a person comes close to or between balustrades 22. On longer escalators, the length of the conductive surface can become somewhat resonant and acts like an antenna. In such cases, a propagating electric field may exist on balustrades 22 and interfere with surrounding electronic devices. In such applications, conductive surface 60 can be split into two or more sections on each interior surface of the balustrade 22, as illustrated by optional dividing line 63. Adding a multiplexer to detection circuitry 42 would allow the multiple sections to communicate with the other components of detection circuit 42. Alternatively, multiple comparators 44 could be used to allow the sections to communicate with controller 46.

In operation, when a change in capacitance is detected by capacitive sensor 40 due to the presence of a person on escalator 10, detection circuit 42 may determine whether to change operation of escalator 10. For instance, as a person approaches escalator 10 and enters the space between balustrades 22, escalator 10 can "wake up" from a low power or energy saving mode, and enter a regular transport mode, either immediately or gradually from a slower speed. If a person is on escalator 10 and there is an emergency, escalator 10 can enter a gentle stop mode in order to keep from stopping abruptly. Also, if a person is located on a stopped escalator 10, detection of the person can be used to avoid starting escalator 10.

Detection system 30 can also be used to detect a person in machine rooms 26, 28. Machine rooms 26, 28 are each located adjacent steps 16 and balustrade 22 (as shown in FIG. 1). In order to detect a person in machine rooms 26, 28, drive system 24 and/or other electrically conductive components within each machine room 26, 28 are grounded. A sense wire (not shown) is installed in the machine room 26, 28 (preferably at mid-height) and is ground-isolated, to form first electrode 54. The grounded components form second electrode 56. The same circuitry discussed above with respect to FIG. 2 is also used to create electric field 52 for the machine room application.

When there is no one in machine room 26, the capacitance between the sense wire and the grounded components, such as drive system 24, is constant. When a person or another object enters machine room 26, the capacitance between the sense wire and the grounded components, such as drive system 24, changes due to the difference between the dielectric constant or permittivity of a person and that of air. This change in capacitance is detected by detection circuit 42 in the same or a similar manner as described above with respect to FIG. 2. If a person is detected in machine room 26, operation of escalator 10 is disabled (i.e. all power is cut to the motor to ensure that no parts are moving).

Each of these two applications (i.e. creating a capacitive sensor between the balustrades or in a machine room) may use separate circuitry configured as shown in FIG. 2, or they may share circuitry. Additional circuitry and sensors, which are known in the art, may also be included in order to circumvent the deleterious effects that changes in certain conditions (e.g. temperature and humidity) could have on the capacitance sensing arrangement.

Figure 5:
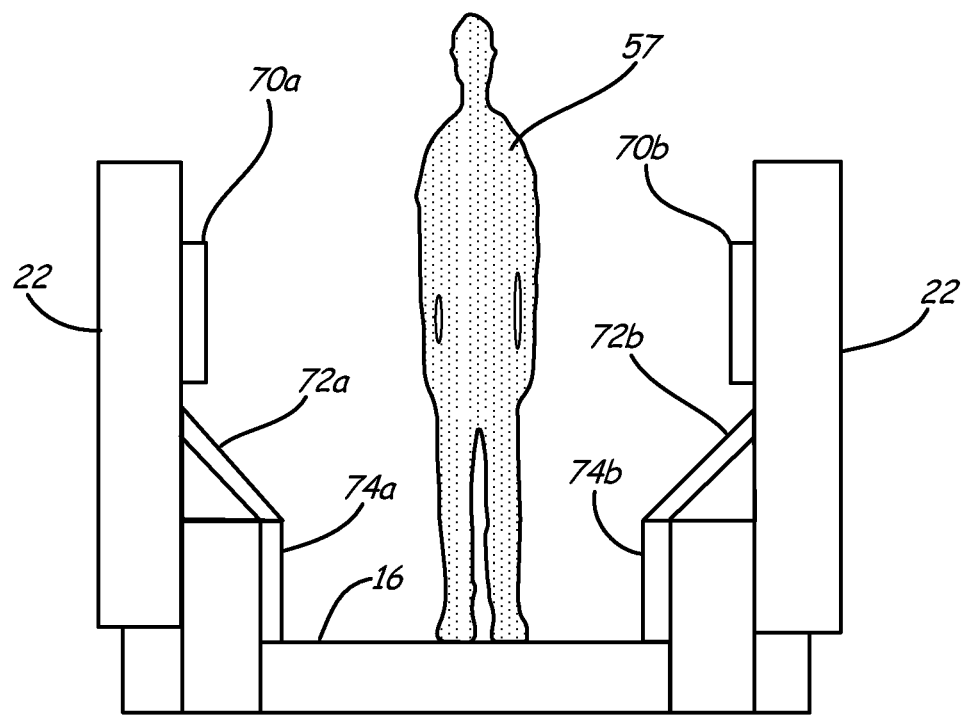
FIG. 5 is a diagram illustrating alternative configurations of electrodes on a passenger conveyor.

FIG. 5 is a diagram illustrating alternative configurations of electrodes on a passenger conveyor to implement the detection system of the present invention. First electrode 54 and second electrode 56 (FIG. 2) may be located on balustrades 22 (as shown at locations 70a and 70b), may be located on the inner decking of the passenger conveyor (as shown at locations 72a and 72b), may be located on the inner skirt of the passenger conveyor (as shown at locations 74a and 74b), or may be located at a combination of one or more of these locations. Suitable electrical isolation of the electrodes is needed to achieve the capacitive sensing functionality of the detection system in any of these configurations. Steps 16, or steps 16 and their accompanying step chains, are used in exemplary embodiments to provide an electrically isolated connection to a fixed potential (such as ground), with an electrode connected in order to implement the above-described loading mode of detection.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for detecting a person relative to a passenger conveyer having a structural component and a passenger riding area, the system comprising:
   a driving circuit for supplying an oscillating drive signal;
   a capacitive sensor having a first electrode configured to produce an electric field toward a second electrode in response to the oscillating drive signal;
   a detection circuit connected to the capacitive sensor that senses a change in capacitance of the capacitive sensor and produces an output as a function of capacitance; and
   a controller responsive to the detection circuit output to selectively adjust an operation mode of the passenger conveyor;

wherein the first and second electrodes are disposed on portions of the passenger conveyor structural component on opposite sides of the passenger riding area, and wherein a change in capacitance is caused by the presence of a person in the electric field between the first and second electrodes;

the driving circuit further comprising:

an oscillator for creating an oscillating drive signal;

an amplifier connected to the oscillator to amplify the oscillating drive signal;

an impedance matching network connected between the amplifier and the capacitive sensor; and a mode selector operable to drive the capacitive sensor in a selected mode.

2. The system of claim 1, wherein the oscillator has a frequency of 100 kHz to 1 MHz.

3. The system of claim 1, wherein the oscillator has a frequency of 100 kHz to 150 kHz.

4. The system of claim 1, wherein the detection circuit comprises: a comparator configured to sense the change in capacitance of the capacitive sensor and produce the output as a function of capacitance of the capacitive sensor.

5. The system of claim 1, wherein
the passenger conveyor structural component is a balustrade, and the first electrode comprises a conducting surface of the balustrade on one side of the passenger riding area, and the second electrode comprises a conducting surface of the balustrade on the opposite side of the passenger riding area.

6. The system of claim 5, wherein the balustrade is formed from a non-conducting material and a conductive material is disposed on a surface thereof on opposite sides of the passenger riding area.

7. The system of claim 6, wherein the non-conducting material is glass.

8. The system of claim 6, wherein the conductive material is adhered to the surface of the non-conducting balustrade.

9. The system of claim 6, wherein the conductive material is formed integrally with the non-conducting balustrade.

10. The system of claim 6, wherein the conductive material is divided into multiple sections.

11. The system of claim 10, wherein a multiplexer connects the sections to transmit the output of the capacitive sensor to the detection circuit.

* * * * *